US012721042B2

(12) United States Patent
Hua et al.

(10) Patent No.: US 12,721,042 B2
(45) Date of Patent: Aug. 25, 2026

(54) PIEZOELECTRIC MATERIALS AND PIEZOELECTRIC DEVICES

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Hui Hua, Beijing (CN); Yuju Chen, Beijing (CN); Xiaofeng Yin, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 1093 days.

(21) Appl. No.: 17/778,172

(22) PCT Filed: Jun. 23, 2021

(86) PCT No.: PCT/CN2021/101800
§ 371 (c)(1),
(2) Date: May 19, 2022

(87) PCT Pub. No.: WO2022/266880
PCT Pub. Date: Dec. 29, 2022

(65) Prior Publication Data
US 2024/0215453 A1 Jun. 27, 2024

(51) Int. Cl.
*H01L 41/18* (2006.01)
*C01G 25/00* (2006.01)
(Continued)

(52) U.S. Cl.
CPC ....... *H10N 30/8554* (2023.02); *C01G 25/006* (2013.01); *G06F 3/016* (2013.01);
(Continued)

(58) Field of Classification Search
CPC ......................... H10N 30/8554; H10N 30/302
(Continued)

(56) References Cited

U.S. PATENT DOCUMENTS 6,312,816 B1 11/2001 Roeder et al.
2005/0162047 A1* 7/2005 Torii ...................... B41J 2/1623 310/358
(Continued)

FOREIGN PATENT DOCUMENTS

CN 1935740 A 3/2007
CN 101265091 A 9/2008
(Continued)

OTHER PUBLICATIONS

"Effect of Sr and La co-doping on structural and electrical properties of RF sputtered PZT thin films" Materials Research Express section of vol. 7, Issue 2 The first paragraph of the"2. Experimental details" ; w/English Abstract.
(Continued)

*Primary Examiner* — Derek J Rosenau
(74) *Attorney, Agent, or Firm* — WHDA, LLP

(57) ABSTRACT

A piezoelectric material and a piezoelectric device. The piezoelectric material includes: a matrix, wherein a crystal structure of the matrix is an $ABO_3$-type perovskite structure, the perovskite structure includes a rhombohedral structure and a tetragonal structure that coexist, and the matrix is near a morphotropic phase boundary; and a doping element, wherein the doping element is for replacing an A-site element or a B-site element in the perovskite structure, or filling a space in the perovskite structure, and the doping element is for increasing a difference between a lattice constant of the rhombohedral structure and a lattice constant of the tetragonal structure.

12 Claims, 6 Drawing Sheets

(51) Int. Cl.

| | |
|---|---|
| ***G06F 3/01*** | (2006.01) |
| ***H10N 30/30*** | (2023.01) |
| ***H10N 30/853*** | (2023.01) |

(52) U.S. Cl.
CPC ....... *H10N 30/302* (2023.02); *C01P 2002/34* (2013.01); *C01P 2002/52* (2013.01); *C01P 2002/77* (2013.01); *C01P 2006/40* (2013.01)

(58) Field of Classification Search
USPC ........................ 310/358; 252/62.9 R, 62.9 PZ
See application file for complete search history.

(56) References Cited

U.S. PATENT DOCUMENTS

| | | | | |
|---|---|---|---|---|
| 2008/0239017 | A1* | 10/2008 | Takabe | B41J 2/1629 29/25.35 |
| 2011/0316937 | A1* | 12/2011 | Arakawa | H10N 30/076 347/68 |
| 2012/0038713 | A1 | 2/2012 | Naono | |
| 2012/0075221 | A1* | 3/2012 | Yasuda | H10N 30/081 345/173 |
| 2017/0110648 | A1 | 4/2017 | Doi et al. | |
| 2018/0321783 | A1 | 11/2018 | Guo et al. | |
| 2019/0042044 | A1 | 2/2019 | Zhao et al. | |
| 2019/0179471 | A1 | 6/2019 | Kim et al. | |
| 2020/0209997 | A1 | 7/2020 | Kim et al. | |

FOREIGN PATENT DOCUMENTS

| | | | | |
|---|---|---|---|---|
| CN | 101632054 | A | 1/2010 | |
| CN | 102420285 | A | 4/2012 | |
| CN | 106133932 | A | 11/2016 | |
| CN | 107452781 | A | 12/2017 | |
| CN | 108899353 | A | 11/2018 | |
| CN | 109244108 | A | 1/2019 | |
| CN | 112580461 | A | 3/2021 | |
| EP | 1956466 | A1 | 8/2008 | |
| JP | 2003-212545 | * | 7/2003 | C01G 25/00 |
| JP | 2003-212545 | A | 7/2003 | |
| JP | 2007-188954 | A | 7/2007 | |
| JP | 2009-049220 | A | 3/2009 | |
| JP | 2009-242229 | A | 10/2009 | |
| JP | 2013-118234 | A | 6/2013 | |
| JP | 2019-075419 | A | 5/2019 | |
| JP | 2019-153858 | A | 9/2019 | |

OTHER PUBLICATIONS

P. Kour et. al., Electrical properties of calcium modified PZT(52/48)ceramics Solid State Communications; 2014 (Apr. 15, 2014) vol. 190 ISSN: 0038-1098: p. 33, paragraph 1 through p. 36, paragraph 1, Figure 1, and Table 1; w/English Abstract.

M.Cerqueira et. al., Piezoelectric behaviour of PZT doped with calcium:a combined experimental and theoretical study Journal of Materials Science 1997(May 31, 1997) vol. 32, ISSN: 0022-2641, p. 2381, para. 3; w/ English Abstract.

S.Ibraliim et. al. Manganese Substitution Effect on the Perovskite-type Pb(Zr0.53Ti0.47)03 Structure Egypt.J 2003 (Dec. 31, 2003) vol. 2, vol. 26, p. 140, paragraphs 3 through 150; w/English Abstract.

Balgovind Tiwari et. al., Effect of Manganese Doping on Dielectric Characteristics of Lead Zirconate Titanate of Different Zirconium/Titanium Ratios IOP Conference Series: Materials Science and Engineering (Feb. 29, 2020) vol. 764, vol. 1, ISSN: 1757-8981, Paras. 2-3, p. 2; w/English Abstract.

Notice of Reasons for Refusal dated Mar. 4, 2025, issued in counterpart JP Application No. 2023-524419, with English translation. (14 pages).

Akkopru-Akgun B. et al., The influence of Mn doping on the leakage current mechanisms and resistance degradation behavior in lead zirconate titanate films, Acta Materialia, vol. 208, No. 116680, p. 1-8, 2021. (8 pages); cited in Extended European Search Report dated Jan. 26, 2024.

Prasad Bag S. et al., Impact of Sr-doping on structural and electrical properties of Pb(Zr0.52Ti0.48)03 thin films on RuO2 electrodes, Ceramics International vol. 43, p. 9806-9814, 2017. (9 pages); cited in Extended European Search Report dated Jan. 26, 2024.

Liu S. et al., Novel ferroelectric capacitor for non-volatile memory storage and biomedical tactile sensor applications. Thin Solid Films, vol. 518, p. e152-e155, 2010. (4 pages); cited in Extended European Search Report dated Jan. 26, 2024.

Glinsek S. et al., Fully Transparent Friction-Modulation Haptic Device Based on Piezoelectric Thin Film, Advanced Functional Materials, vol. 30, No. 2003539, p. 1-8, 2020. (8 pages); cited in Extended European Search Report dated Jan. 26, 2024.

Extended (Supplementary) European Search Report dated Jan. 26, 2024, issued in counterpart EP Application No. 21946381.7. (12 pages).

* cited by examiner

PIEZOELECTRIC MATERIALS AND PIEZOELECTRIC DEVICES

TECHNICAL FIELD

The present disclosure relates to the technical field of piezoelectrics, and particularly relates to a piezoelectric material and a piezoelectric device.

BACKGROUND

Tactile-reproduction devices based on piezoelectric materials may regulate the friction of the surface of the substrate via the resonance generated between the piezoelectric-material layer and the substrate, thereby realizing texture reproduction of an object on the surface of the substrate.

However, as affected by the intrinsic properties of the materials, current piezoelectric materials have a low piezoelectric effect, which restricts further extensive application of them in touch-controlled reproduction devices.

SUMMARY

The present disclosure provides a piezoelectric material, wherein the piezoelectric material includes:

a matrix, wherein a crystal structure of the matrix is an $ABO_3$-type perovskite structure, the perovskite structure includes a rhombohedral structure and a tetragonal structure that coexist, and the matrix is near a morphotropic phase boundary; and a doping element, wherein the doping element is for replacing an A-site element or a B-site element in the perovskite structure, or filling a space in the perovskite structure, and the doping element is for increasing a difference between a lattice constant of the rhombohedral structure and a lattice constant of the tetragonal structure.

In an optional implementation, the matrix is lead zirconate titanate, and a zirconium-to-titanium ratio of the lead zirconate titanate is 52:48 or 53:47.

In an optional implementation, the doping element is for replacing the A-site element in the perovskite structure, and the doping element and the A-site element have a same valence state in the perovskite structure.

In an optional implementation, the matrix is lead zirconate titanate, and the doping element is calcium.

In an optional implementation, a molar percentage of the doping element in the matrix is less than or equal to 20%.

In an optional implementation, the molar percentage of the doping element in the matrix is less than or equal to 10%.

In an optional implementation, the doping element is for replacing the B-site element in the perovskite structure, and the doping element and the B-site element have a same valence state in the perovskite structure.

In an optional implementation, the matrix is lead zirconate titanate, and the doping element is manganese.

In an optional implementation, the doping element is for filling a space in the perovskite structure, and an atomic weight of the doping element is less than or equal to 6.

In an optional implementation, the matrix is lead zirconate titanate, and the doping element includes at least one of carbon and boron.

The present disclosure provides a piezoelectric device, wherein the piezoelectric device includes a substrate and a piezoelectric element disposed on one side of the substrate, the piezoelectric element includes a first electrode, a piezoelectric layer and a second electrode that are arranged in layer configuration on the one side of the substrate, and a material of the piezoelectric layer includes the piezoelectric material according to any one of the above embodiments.

In an optional implementation, the substrate is a displaying substrate, the displaying substrate includes a displaying region and a non-displaying region located at a periphery of the displaying region, and the piezoelectric element is disposed on a light exiting side of the displaying substrate.

In an optional implementation, an orthographic projection of the piezoelectric element on the displaying substrate is located within the displaying region, a thickness of the piezoelectric layer is less than or equal to 2 μm, and the first electrode and the second electrode are transparent electrodes.

In an optional implementation, a thickness of the first electrode and a thickness of the second electrode are greater than or equal to 200 nm, and less than or equal to 500 nm.

In an optional implementation, an orthographic projection of the piezoelectric element on the displaying substrate is located within the non-displaying region, the piezoelectric element is a plurality of piezoelectric elements, the plurality of piezoelectric elements are divided into two groups, and the piezoelectric elements in each of the groups are arranged in a first direction, and are arranged adjacently to two opposite side edges of the substrate.

In an optional implementation, a material of the first electrode and a material of the second electrode include platinum.

In an optional implementation, a film-layer stress of the first electrode, a film-layer stress of the piezoelectric layer and a film-layer stress of the second electrode are greater than or equal to −300 MPa, and less than or equal to 300 MPa.

In an optional implementation, the first electrode is disposed close to the substrate, an edge of the second electrode is retracted relative to an edge of the piezoelectric layer, and a retraction amount is greater than or equal to 100 μm, and less than or equal to 500 μm.

In an optional implementation, the first electrode is connected to ground, the second electrode is connected to an alternating-current-signal input terminal, the alternating-current-signal input terminal is for inputting an alternating-current signal, and a frequency of the alternating-current signal is equal to an inherent frequency of the substrate.

In an optional implementation, the piezoelectric device further includes a touch-controlling layer, and the touch-controlling layer is disposed on one side of the piezoelectric element that is close to or further from the substrate.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are embodiments of the present disclosure, and a person skilled in the art may obtain other figures according to these figures without paying creative work. It should be noted that the proportions in the drawings are merely illustrative and do not indicate the actual proportions.

DETAILED DESCRIPTION

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

An embodiment of the present disclosure provides a piezoelectric material, wherein the piezoelectric material includes a matrix and a doping element.

The crystal structure of the matrix is an $ABO_3$-type perovskite structure, the perovskite structure includes a rhombohedral structure and a tetragonal structure that coexist, and the matrix is near a morphotropic phase boundary.

The doping element is for replacing an A-site element or a B-site element in the perovskite structure, or filling a space in the perovskite structure, and the doping element is for increasing a difference between a lattice constant of the rhombohedral structure and a lattice constant of the tetragonal structure.

Figure 1:
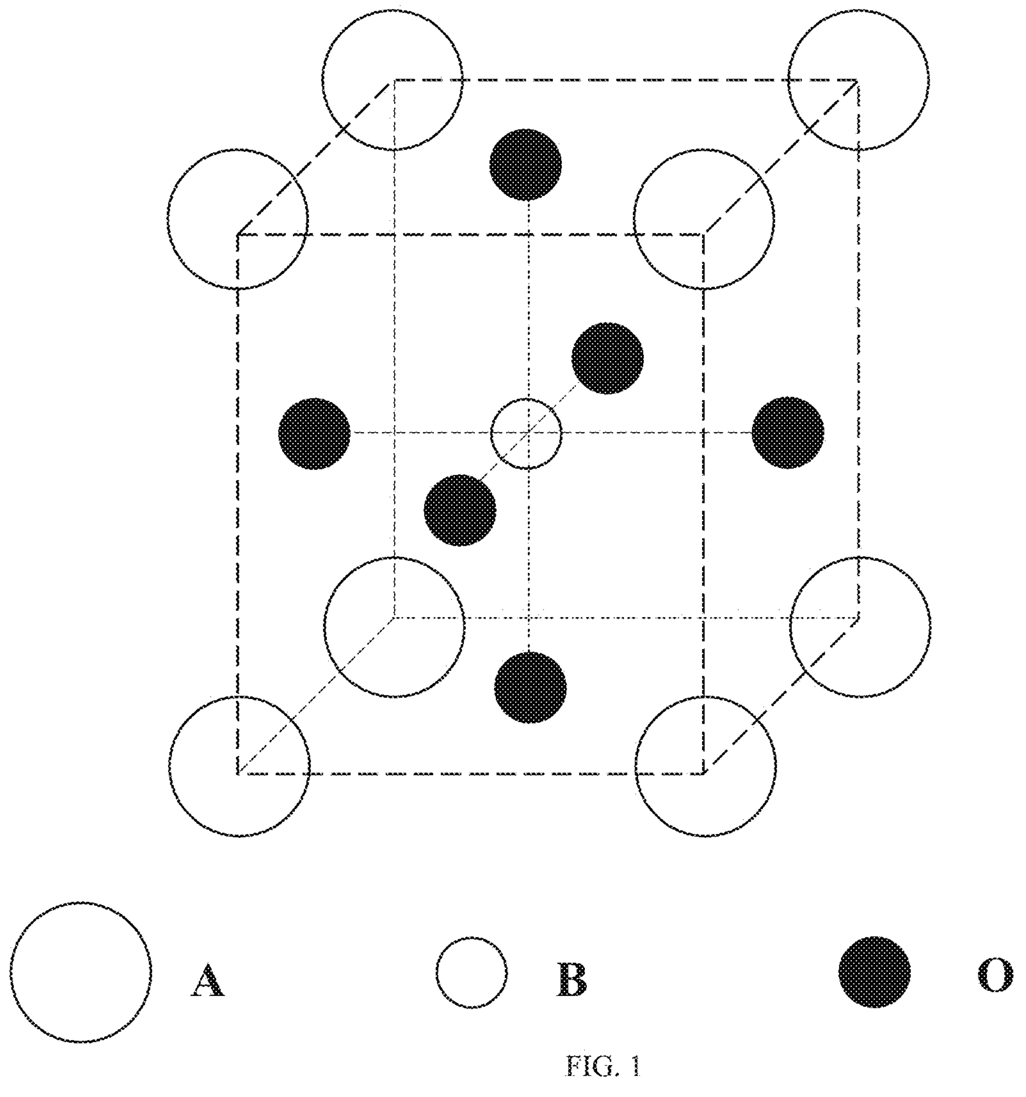
FIG. 1 shows a unit cell diagram of the perovskite structure according to an embodiment of the present disclosure.

Referring to FIG. 1, FIG. 1 shows the unit cell diagram of a perovskite structure. The perovskite structure is an octahedron. The A-site element of the $ABO_3$-type perovskite structure is located at the vertexes of the octahedron, the B-site element is located at the center point of the octahedron, and the O-site element is located at the face-center position of the octahedron.

The piezoelectric and ferroelectric properties of the perovskite structure may be changed by substitution doping or space doping. The substitution doping may be implemented by substituting the doping element for the A-site element or the B-site element. The space doping may be implemented by filling the spaces in the perovskite structure with the doping element.

The matrix near the morphotropic phase boundary (MPB) has two coexistent phases (corresponding to two crystal structures: a rhombohedral structure and a tetragonal structure). The two crystal structures have close energies, and, when the external condition changes, for example, an electric field or stress is applied, interconversion between the two crystal structures happens, whereby the composition near the morphotropic phase boundary has the maximum values of the dielectric property and the piezoelectricity.

In an optional implementation, the matrix is lead zirconate titanate, which is not limited in the present embodiment.

In an optional implementation, the doping element is an element such as calcium, carbon and boron, which is not limited in the present embodiment.

In the present embodiment, the case in which the material of the matrix is lead zirconate titanate and the doping element is calcium will be taken as an example for the description.

The lead zirconate titanate is of the $ABO_3$-type perovskite structure, wherein the A sites are $Pb^{2+}$, and the B site is $Zr^{4+}$ or $Ti^{4+}$.

Figure 2:
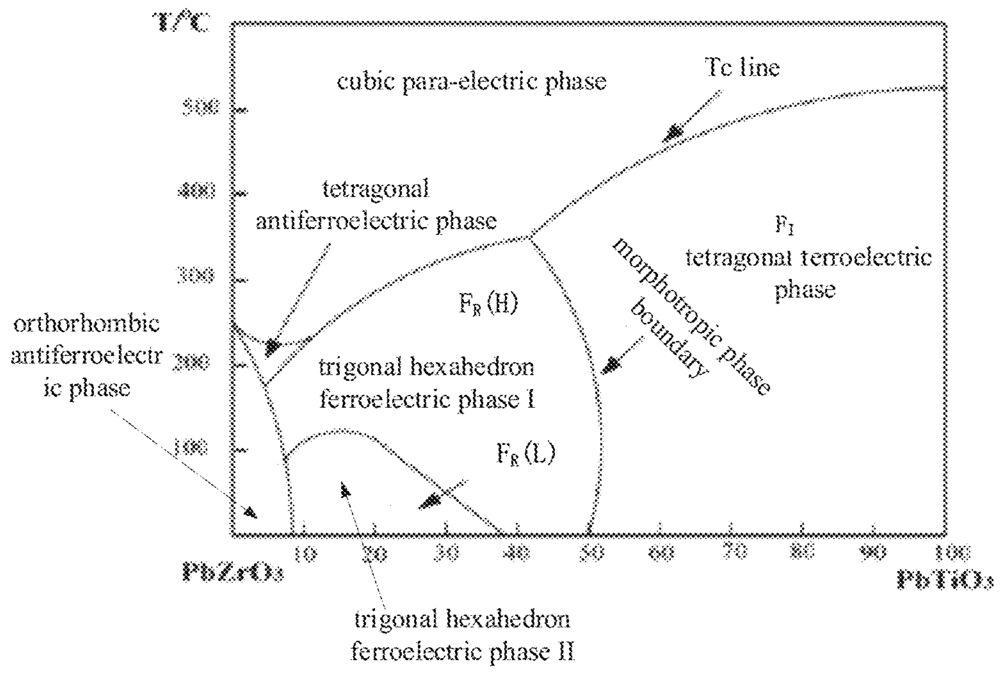
FIG. 2 shows a phase diagram of the lead zirconate titanate according to an embodiment of the present disclosure.

Referring to FIG. 2, FIG. 2 shows the phase diagram of lead zirconate titanate. Lead zirconate titanate is the solid solution of lead zirconate ($PbZrO_3$) and lead titanate ($PbTiO_3$). The composition rich in zirconium has a rhombohedral structure, and the composition rich in titanium has a tetragonal structure. When the zirconium-to-titanium ratio of the lead zirconate titanate may be 52:48 or 53:47, the lead zirconate titanate is near the morphotropic phase boundary.

When no doping is performed, the composition of the lead zirconate titanate of the matrix is near the morphotropic phase boundary, and is in a state in which the two phases of the rhombohedral structure and the tetragonal structure coexist. The inventor has found that, with the increasing of the $Ca^{2+}$ doping, the two phases still coexist; in other words, the $Ca^{2+}$ doping does not influence the existence of the area of the morphotropic phase boundary.

Figure 3:
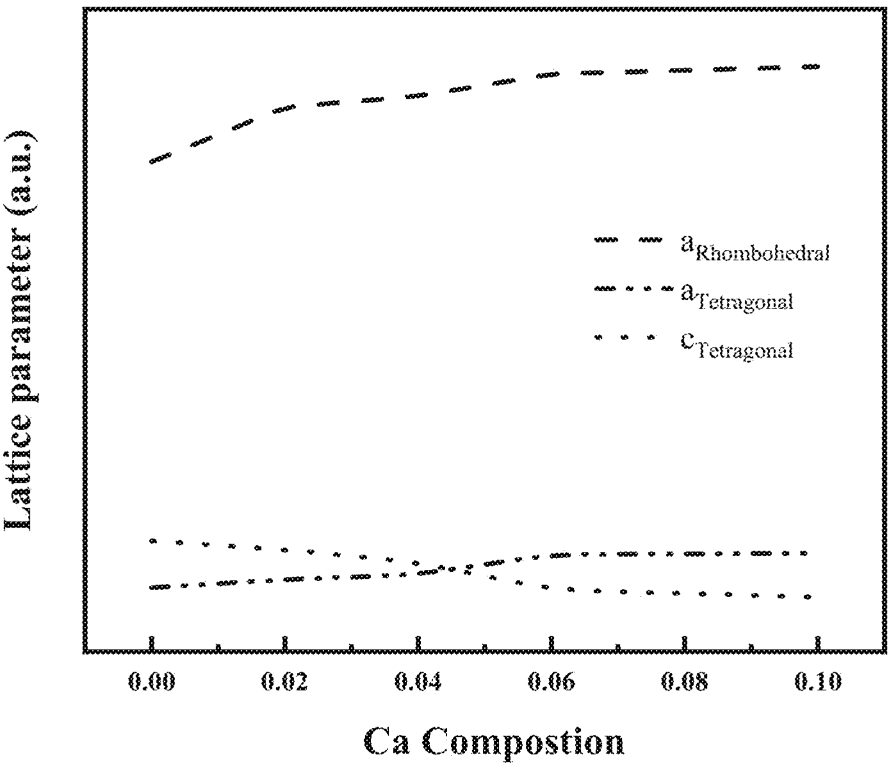
FIG. 3 shows a variation trend of the lattice constant according to an embodiment of the present disclosure.

Referring to FIG. 3, FIG. 3 shows the variation of the lattice constant of $Pb_{1-x}Ca_xZr_{0.53}Ti_{0.47}O_3$ with the increasing of the $Ca^{2+}$ content. It may be seen from FIG. 3 that, with the increasing of the $Ca^{2+}$ content, the lattice constant $a_R$ of the rhombohedral structure increases continuously, and the short-axis lattice constant $a_T$ of the tetragonal structure also increases correspondingly. However, the acceleration of the increasing of $a_T$ is less than that of $a_R$, and therefore the difference between the lattice constant $a_R$ of the rhombohedral structure and the short-axis lattice constant $a_T$ of the tetragonal structure increases. In addition, the lattice constant $a_R$ of the rhombohedral structure increases continuously, and the long-axis lattice constant $c_T$ of the tetragonal structure decreases gradually. Therefore, the difference between the lattice constant $a_R$ of the rhombohedral structure and the long-axis lattice constant $c_T$ of the tetragonal structure also increases. Therefore, the difference between the lattice constant $a_R$ of the rhombohedral structure and the lattice constant $a_T$ or $c_T$ of the tetragonal structure increases.

Figure 4:
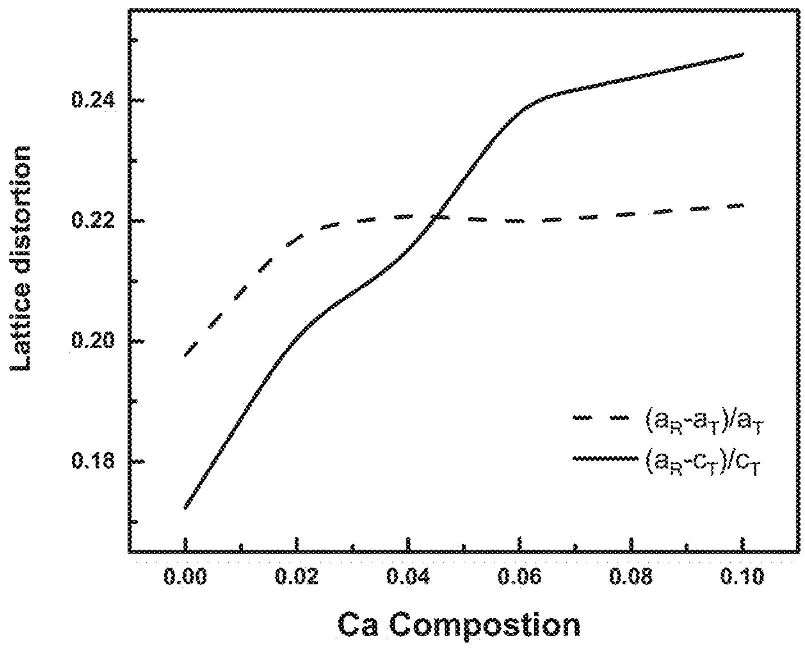
FIG. 4 shows a variation trend of the lattice strain according to an embodiment of the present disclosure.

The source of the strain near the morphotropic phase boundary is mainly the interconversion between the tetragonal phase and the rhombohedral phase. Referring to FIG. 4, FIG. 4 shows the lattice-strain amounts generated in the phase transformation. It may be seen from FIG. 4 that, with the increasing of the $Ca^{2+}$ content, in the transformation from the tetragonal phase to the rhombohedral phase, because the difference between the lattice constant ($a_R$) of the rhombohedral structure and the lattice constant ($a_T$ or $c_T$) of the tetragonal structure increases, both of the lattice-strain amounts $(a_R-a_T)/a_T$ and $(a_R-c_T)/c_T$ correspondingly increase. Wherein $(a_R-a_T)/a_T$ represents the strain amount generated when all of the short-axis $a_T$ of the tetragonal phase are transformed into $a_R$, $(a_R-c_T)/c_T$ represents the strain amount generated when all of the long-axis $c_T$ of the tetragonal phase are transformed into $a_R$, and the actual lattice-strain amount is between them.

Because the $Ca^{2+}$ doping does not influence the existence of the area of the morphotropic phase boundary, or, in other words, $Pb_{1-x}Ca_xZr_{0.53}Ti_{0.47}O_3$ still exhibits the coexistence of the rhombohedral structure (the rhombohedral phase) and the tetragonal structure (the tetragonal phase. When an electric field is applied, the rhombohedral structure and the tetragonal structure very easily have the transformation between the phase structures thereof, and when the difference between the lattice constants of the rhombohedral structure and the tetragonal structure increases, the maximum value of the lattice strain of the strain material may be increased.

Therefore, by increasing the difference between the lattice constants of the two phases (i.e., the rhombohedral phase and the tetragonal phase) near the composition of the morphotropic phase boundary, i.e., increasing the difference between the lattice constants before and after the phase transformation, a large strain may be generated, thereby increasing the maximum value of the intrinsic strain.

In the piezoelectric material according to the present embodiment, the matrix of the perovskite structure is doped by the doping element, and is near the morphotropic phase boundary. Under the effect of an external electric field, the material near the morphotropic phase boundary very easily has the mutual transformation between the rhombohedral structure and the tetragonal structure. Because the doping element may increase the difference between the lattice constants of the rhombohedral structure and the tetragonal structure, that may increase the lattice-strain amounts caused by the phase transformation, increase the maximum value of the intrinsic strain, and improve the piezoelectricity of the piezoelectric material. The increasing of the maximum value of the intrinsic strain of the piezoelectric material facilitates to increase the amplitude of the piezoelectric device, realizes the effective conversion between electric energy and mechanical energy, enlarges the tactile sensation, and improves the effect of tactile reproduction.

The piezoelectric material according to the present embodiment may realize interconversion between mechanical energy and electric energy, wherein when applied a mechanical pressure or a tension the piezoelectric material may generate electric charges, and when placed in an electric field the material has mechanical deformation of compression or stretching. Therefore, the piezoelectric material may be applied to fields such as drivers and sensors, for example, in ultrasonic probes, pressure sensors, energy collectors, tactile reproduction, microfluidics, loudspeakers and so on.

The piezoelectric material according to the present embodiment may be prepared by using methods such as sol-gel, magnetron sputtering and chemical vapor deposition. The sol-gel process may accurately control the compositions and the doping proportion of the film layer.

When the material of the matrix is lead zirconate titanate, in the preparation, the lead-zirconate-titanate film layer is required to be annealed quickly at a high temperature (>550° C.) under an oxygen atmosphere for 30 min, thereby forming the perovskite crystalline phase. In the preparation of the sol-gel solution or the preparation of the magnetron-sputtering target material, excessive Pb less than 20 mol % (molar percentage 20%) may be added, and the zirconium-to-titanium ratio is Zr/Ti=52/48 or 53/47, to enable the matrix to be near the morphotropic phase boundary. The doping element may be added in the preparation of the sol-gel solution or the preparation of the magnetron-sputtering target material.

When the doping into the matrix by the doping element is substitution doping, the doping element and the substituted element may be equivalent doping or non-equivalent doping. The non-equivalent doping refers to doping with an ion whose valence is different from the valence of the substituted element, and includes donor doping and acceptor doping, for example, substituting $Pb^{2+}$ with $La^{3+}$ and so on. The equivalent doping refers to doping with an ion whose valence is equal to the valence of the substituted element, for example, substituting $Pb^{2+}$ with $Ca^{2+}$ and so on.

The inventor has found that, when non-equivalent doping is performed in the matrix, when the donor element or the acceptor element is added too much, that easily results in off-balance of the ions, the quantity of the positive/negative charges might increase, and a nonuniform internal electric field might be generated inside the piezoelectric material, which finally results in that the thin film is easily broken down.

In order to solve the problem of ion off-balance, in an optional implementation, the doping element is for replacing the A-site element in the perovskite structure, and the doping element and the A-site element have a same valence state in the perovskite structure. Accordingly, by the equivalent substitution doping to the A-site element, the leakage current and the dielectric constant of the piezoelectric material are not influenced, which prevents the problem of ion off-balance caused by a too high doping amount.

In a particular implementation, when the matrix is lead zirconate titanate, the A-site element is $Pb^{2+}$, and the doping element substituting the A sites may be calcium, i.e., substituting $Pb^{2+}$ with $Ca^{2+}$.

In order to ensure that the piezoelectric material is always near the morphotropic phase boundary, the molar percentage of the doping element in the matrix may be less than or equal to 20%. In other words, the molar percentage of the doping element $Ca^{2+}$ in the total amount of ($Pb^{2+}$ and $Ca^{2+}$) is less than or equal to 20%.

In a particular implementation, the molar percentage of the doping element in the matrix may be less than or equal to 10%, as shown in FIGS. 3 and 4.

In order to solve the problem of ion off-balance, in another optional implementation, the doping element is for replacing the B-site element in the perovskite structure, and the doping element and the B-site element have a same valence state in the perovskite structure. Accordingly, by the equivalent substitution doping to the B-site element, the leakage current and the dielectric constant of the piezoelectric material are not influenced, which prevents the problem of ion off-balance caused by a too high doping amount.

In a particular implementation, when the matrix is lead zirconate titanate, the B-site element is $Zr^{4+}$ or $Ti^{4+}$, and the doping element substituting the B sites may be manganese, i.e., substituting $Zr^{4+}$ or $Ti^{4+}$ with $Mn^{4+}$.

In an optional implementation, the doping element is for filling a space in the perovskite structure, and the atomic weight of the doping element may be less than or equal to 6.

For example, when the matrix is lead zirconate titanate, the doping element of the space doping may include at least one of carbon and boron.

Figure 5:
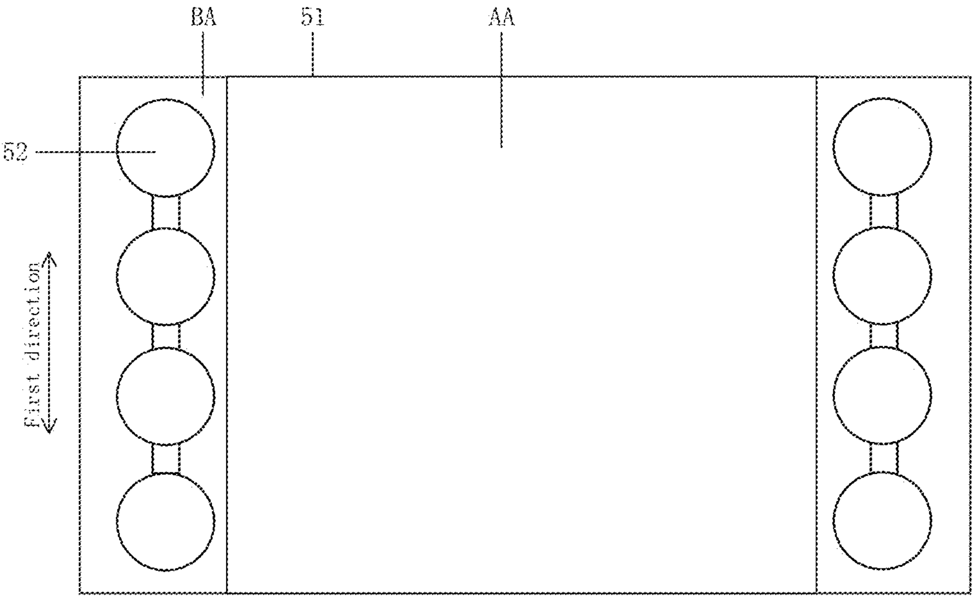
FIG. 5 shows a schematic planar structural diagram of the piezoelectric device according to an embodiment of the present disclosure.

An embodiment of the present disclosure provides a piezoelectric device. Referring to FIG. 5, the piezoelectric device includes a substrate 51 and a piezoelectric element 52 provided on one side of the substrate 51. Referring to FIG.

6, the piezoelectric element 52 includes a first electrode 61, a piezoelectric layer 62 and a second electrode 63 that are arranged in layer configuration on the one side of the substrate 51, wherein the material of the piezoelectric layer 62 may include the piezoelectric material according to any one of the above embodiments.

The substrate 51 may be silicon-based, and may also be silicon-based provided with a thermal-oxidation layer, i.e., $SiO_2$/Si (100), and the substrate 51 may also be a transparent glass, a displaying substrate and so on, which is not limited in the present embodiment.

The material of the first electrode 61 may include at least one of metal materials such as platinum, gold, aluminum and copper, and may also include at least one of transparent metal oxides such as indium tin oxide (ITO), indium zinc oxide (IZO) and oxidized graphene, which is not limited in the present embodiment.

The material of the second electrode 63 may include at least one of metal materials such as platinum, gold, aluminum and copper, and may also include at least one of transparent metal oxides such as indium tin oxide (ITO), indium zinc oxide (IZO) and oxidized graphene, which is not limited in the present embodiment.

It should be noted that a shape of the piezoelectric element 52 is not limited in the present embodiment, and it may be a circle shown in FIG. 5, and may also be a rectangle, a pentagon, a hexagon and so on.

In the present embodiment, the first electrode 61 and the second electrode 63 are used to form the alternating electric field, and the piezoelectric layer 62 is used to generate vibration under the action of the alternating electric field, and drive the substrate 51 to resonate.

Under the action of the alternating electric field, the piezoelectric layer 62 deforms and generates a vibration signal. The frequency of the vibration signal is equal to the frequency of the alternating electric field. When the frequency of the vibration signal is close to or equal to the inherent frequency of the substrate 51, the piezoelectric layer 62 and the substrate 51 have resonance therebetween, and the amplitude is increased, to generate a tactile feedback signal. When the surface of the piezoelectric device is touched by a finger, the changing of the friction may be obviously felt. Therefore, the friction of the surface of the piezoelectric device may be regulated by using the resonance generated between the piezoelectric layer 62 and the substrate 51, thereby realizing texture reproduction of an object.

The piezoelectric device according to the present embodiment, because the piezoelectric material has a high intrinsic strain, the amplitude of the resonance generated by the piezoelectric layer and the substrate may be increased the surface tactile sensation is enlarged, and the effect of tactile reproduction is improved.

In an optional implementation, the piezoelectric device according to the present embodiment may further include a touch-controlling layer, and the touch-controlling layer is provided on the side of the piezoelectric element 52 that is close to or further from the substrate 51. In other words, the touch-controlling layer may be disposed between the substrate 51 and the piezoelectric element 52, and may also be disposed on the side of the piezoelectric element 52 that is further from the substrate 51. By disposing the touch-controlling layer, the piezoelectric device may have the function of touch controlling.

In order to prevent film-layer cracking, the film-layer stress of the first electrode 61 may be greater than or equal to −300 MPa, and less than or equal to 300 MPa, and the maximum value does not exceed 400 MPa. The film-layer stress of the piezoelectric layer 62 may be greater than or equal to −300 MPa, and less than or equal to 300 MPa, and the maximum value does not exceed 400 MPa. The film-layer stress of the second electrode 63 may be greater than or equal to −300 MPa, and less than or equal to 300 MPa, and the maximum value does not exceed 400 MPa. That may prevent cracking of any of the film layers or warpage of the entire substrate 51 due to a too large stress.

Regarding the stresses of each of the film layers, the surface warpage degrees may be measured before and after the fabrication of the film layers, and the stresses of the corresponding film layers are calculated according to the measured surface warpage degrees.

Figure 6:
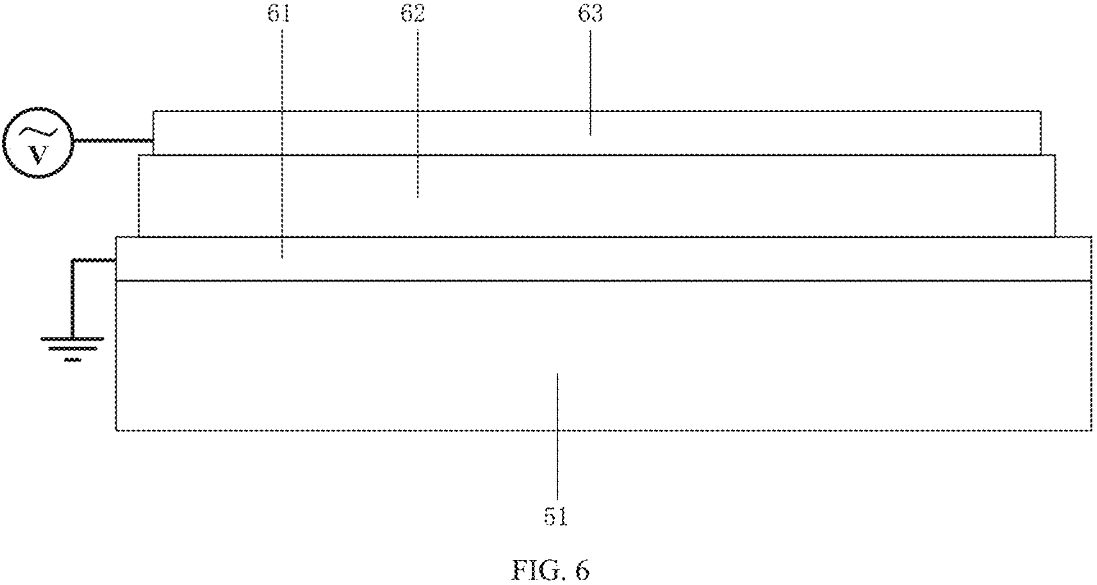
FIG. 6 shows a schematic sectional structural diagram of the piezoelectric device according to an embodiment of the present disclosure.

In a particular implementation, the first electrode 61 may be disposed close to the substrate 51, as shown in FIG. 6.

In an optional implementation, referring to FIG. 6, the edge of the second electrode 63 may be retracted relative to the edge of the piezoelectric layer 62. In other words, the boundaries of the orthographic projection of the second electrode 63 on the substrate 51 are retracted relative to the boundaries of the orthographic projection of the piezoelectric layer 62 on the substrate 51. That may prevent the problem that the piezoelectric layer 62 has serious lateral etching to in turn cause direct contacting between the first electrode 61 and the second electrode 63 to result in short circuit.

The retraction amount of the retraction of the edge of the second electrode 63 relative to the edge of the piezoelectric layer 62 may be greater than or equal to 100 μm, and less than or equal to 500 μm. That may not only prevent short circuit between the first electrode 61 and the second electrode 63, but may also increase the effective vibration area of the piezoelectric layer 62.

The piezoelectric device according to the present embodiment may be fabricated by the following steps: firstly providing the substrate 51; subsequently forming a first electrode-material layer, a piezoelectric-material layer and a second electrode-material layer sequentially on the substrate 51; subsequently etching the second electrode-material layer, to form the second electrode; subsequently etching the piezoelectric-material layer, to form the piezoelectric layer; and finally obtaining the piezoelectric device shown in FIG. 6.

In a particular implementation, a shape of the piezoelectric layer 62 and a shape of the second electrode 63 may be the same. Referring to FIGS. 5 and 6, the second electrode 63 is a circle of a diameter of 8 mm, and the second electrode 63 is a circle of a diameter of 9 mm. Because the edge of the second electrode 63 may be retracted relative to the edge of the piezoelectric layer 62, the piezoelectric layer 62 is slightly larger than the second electrode 63. In FIG. 6 the edge of the second electrode 63 is retracted 500 μm relative to the edge of the piezoelectric layer 62.

Referring to FIG. 6, the distance between the boundaries of the orthographic projection of the second electrode 63 on the substrate 51 and the boundaries of the substrate 51 may be 3 mm. The size of the substrate 51 in FIG. 5 is 71 mm*60 mm.

In the present embodiment, as shown in FIG. 5, the substrate 51 may, for example, be a displaying substrate, and the displaying substrate includes a displaying region AA and a non-displaying region BA located at the periphery of the displaying region AA. Because the substrate 51 is a displaying substrate, that may enable the piezoelectric device to have the function of displaying.

The piezoelectric element 52 may be disposed on the light exiting side of the displaying substrate, which is not limited in the present embodiment.

In an optional implementation, the orthographic projection of the piezoelectric element 52 on the displaying substrate may be located within the displaying region AA. In order not to affect the transmittance of the displaying substrate, the thickness of the piezoelectric layer 62 may be less than or equal to 2 μm. When the thickness of the piezoelectric layer 62 is less than or equal to 2 μm, that may ensure that the film layers have a transmittance above 70%, and may be integrated with the displaying substrate to fabricate a tactile-reproduction device.

In order not to affect the transmittance of the displaying substrate, the first electrode 61 and the second electrode 63 may be transparent electrodes. A material of the first electrode 61 and a material of the second electrode 63 may be transparent metal oxides such as indium tin oxide (ITO), indium zinc oxide (IZO) and oxidized graphene.

In a particular implementation, a thickness of the first electrode 61 and a thickness of the second electrode 63 may, for example, be greater than or equal to 200 nm and less than or equal to 500 nm.

The first electrode 61 may be deposited with the ITO transparent metal oxide by magnetron sputtering, and subsequently annealed at 250 degrees Celsius under a nitrogen atmosphere for 30 min, whereby a crystallize ITO film layer having a low sheet resistance may be obtained.

The piezoelectric layer 62 may be fabricated by using methods such as sol-gel and magnetron sputtering. The growth speed of the film layer of magnetron sputtering may be up to 4 μm/h. The fabrication of the piezoelectric layer 62 may refer to the preparation process of the piezoelectric material, and is not discussed herein further.

The second electrode 63 may be deposited with the ITO transparent metal oxide by magnetron sputtering, and subsequently annealed at 250 degrees Celsius under a nitrogen atmosphere for 30 min, whereby a crystallize ITO film layer having a low sheet resistance may be obtained.

In another optional implementation, the orthographic projection of the piezoelectric element 52 on the displaying substrate may be located within the non-displaying region BA. Accordingly, the piezoelectric element 52 does not affect the transmittance of the displaying region AA. Therefore, in the present implementation, the materials of the first electrode 61 and the second electrode 63 may be a metal material of a low electrical resistivity. For example, the material of the first electrode 61 and the material of the second electrode 63 may include platinum. Platinum has an excellent electric conductivity, an excellent resistance to high-temperature thermal oxidation and an excellent adaptability of the lattice constant to the piezoelectric layer 62, and thus may improve the performance and the reliability of the piezoelectric device.

In the present implementation, the thickness of the piezoelectric layer 62 may be set according to practical demands. Generally, in order to ensure the quality of the film layer, the thickness of the piezoelectric layer 62 may be less than or equal to 10 μm.

In the present implementation, the piezoelectric element 52 may be a plurality of piezoelectric elements, the plurality of piezoelectric elements 52 may be divided into two groups, and the piezoelectric elements 52 in each of the groups are arranged in a first direction, and are arranged adjacently to two opposite side edges of the substrate 51.

It should be noted that the first electrodes 61 of the piezoelectric elements 52 of each of the groups may be of an integral structure. The second electrodes 63 of the piezoelectric elements 52 of each of the groups may be disposed separately, and interconnected by lead wires.

In a particular implementation, as shown in FIG. 6, the first electrode 61 may be connected to ground, the second electrode 63 may be connected to an alternating-current-signal input terminal, and the alternating-current-signal input terminal is for inputting an alternating-current signal. The waveform of the alternating-current signal may be a sine wave, a square wave, a triangular wave and so on.

The frequency of the alternating-current signal may be equal to or close to the inherent frequency of the substrate 51. The frequency of the alternating-current signal is the frequency of the alternating electric field.

Figure 7:
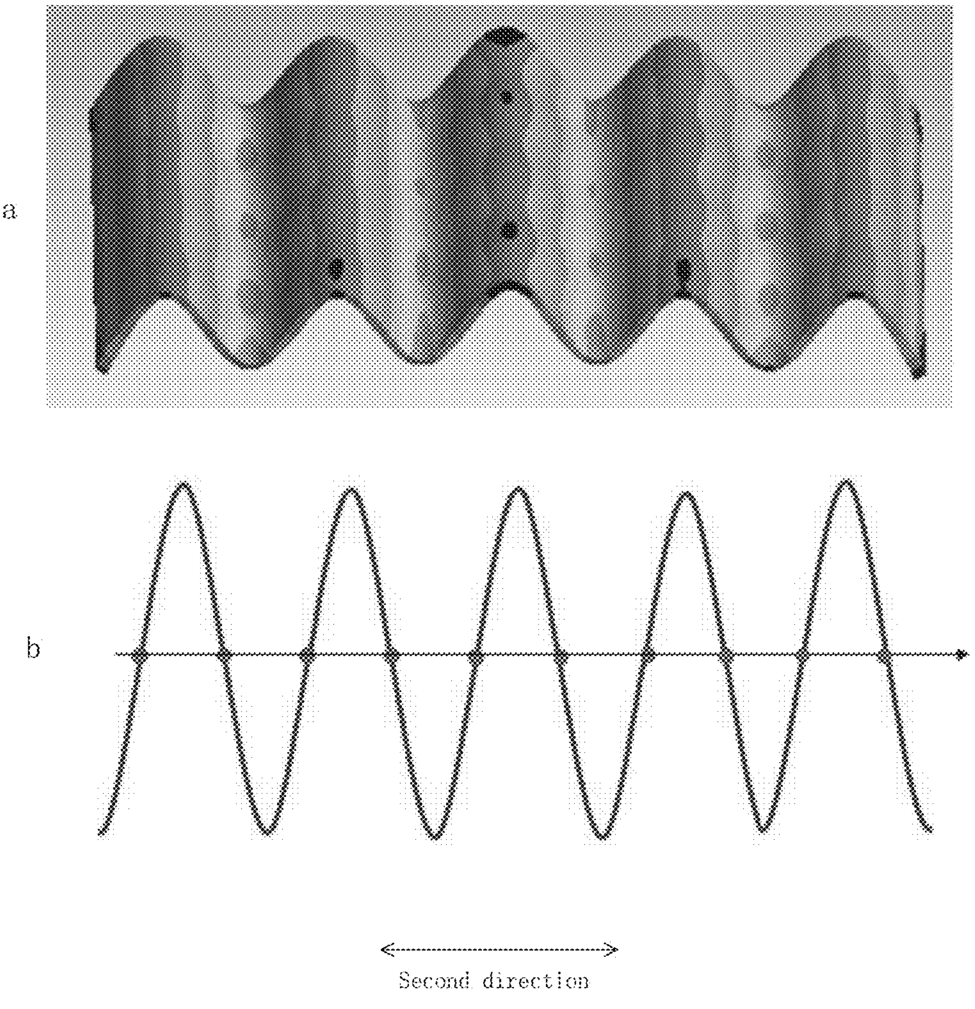
FIG. 7 shows a schematic diagram of the vibration of the piezoelectric device according to an embodiment of the present disclosure.

The substrate 51, when energized by a vibration signal close to the inherent frequency itself, resonates with the piezoelectric element 52, as shown in FIG. 7. When the frequency of the alternating-current signal is 22.8 KHz, the substrate 51 exhibits a vibration mode having 10 nodes in a second direction, wherein each of the node points maintains stationary (the amplitude is always 0), and the positions between the node points vibrate vertically, to form peaks and troughs. When the displacement between the peaks and the troughs is greater than 1 micrometer, if a finger slides on the touching surface, it may obviously sense that the touching surface is smoother. If the amplitude of the piezoelectric layer 62 is higher, then the air film between the finger and the touching surface is squeezed more intensively, the friction is significantly reduced, and the tactile sensation is more obvious. Therefore, the increasing of the maximum value of the intrinsic strain of the material of the piezoelectric layer 62 facilitates to increase the entire amplitude of the device, to realize an excellent function of tactile feedback.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The piezoelectric material and the piezoelectric device according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

A person skilled in the art, after considering the description and implementing the invention disclosed herein, will readily envisage other embodiments of the present disclosure. The present disclosure aims at encompassing any variations, uses or adaptive alternations of the present disclosure, wherein those variations, uses or adaptive alternations follow the general principle of the present disclosure and include common knowledge or common technical means in the art that are not disclosed by the present disclosure. The description and the embodiments are merely deemed as exemplary, and the true scope and spirit of the present disclosure are presented by the following claims.

It should be understood that the present disclosure is not limited to the accurate structure that has been described above and shown in the drawings, and may have various modifications and variations without departing from its scope. The scope of the present disclosure is merely limited by the appended claims.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it may be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail with reference to the above embodiments, a person skilled in the art should understand that he may still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A piezoelectric material, wherein the piezoelectric material comprises:

a matrix, wherein a crystal structure of the matrix is an $ABO_3$-type perovskite structure, the perovskite structure comprises a rhombohedral structure and a tetragonal structure that coexist, and the matrix is near a morphotropic phase boundary; and a doping element, wherein the doping element is for replacing an A-site element in the perovskite structure, and the doping element is for increasing a difference between a lattice constant of the rhombohedral structure and a lattice constant of the tetragonal structure, wherein the matrix is lead zirconate titanate, and a zirconium-to-titanium ratio of the lead zirconate titanate is 52:48, the doping element and the A-site element have a same valence state in the perovskite structure, the doping element is calcium, the A-site element is lead, and the doping element calcium is for replacing the A-site element lead, and a molar percentage of the doping element calcium in a total amount of lead and calcium in the matrix is great than 2% and less than or equal to 20%.

2. The piezoelectric material according to claim 1, wherein the molar percentage of the doping element calcium in the total amount of lead and calcium in the matrix is less than or equal to 10%.

3. A piezoelectric device, wherein the piezoelectric device comprises a substrate and a piezoelectric element disposed on one side of the substrate, the piezoelectric element comprises a first electrode, a piezoelectric layer and a second electrode that are arranged in layer configuration on the one side of the substrate, and a material of the piezoelectric layer comprises the piezoelectric material according to claim 1.

4. The piezoelectric device according to claim 3, wherein the substrate is a displaying substrate, the displaying substrate comprises a displaying region and a non-displaying region located at a periphery of the displaying region, and the piezoelectric element is disposed on a light exiting side of the displaying substrate.

5. The piezoelectric device according to claim 4, wherein an orthographic projection of the piezoelectric element on the displaying substrate is located within the displaying region, a thickness of the piezoelectric layer is less than or equal to 2 μm, and the first electrode and the second electrode are transparent electrodes.

6. The piezoelectric device according to claim 5, wherein a thickness of the first electrode and a thickness of the second electrode are greater than or equal to 200 nm, and less than or equal to 500 nm.

7. The piezoelectric device according to claim 4, wherein an orthographic projection of the piezoelectric element on the displaying substrate is located within the non-displaying region, the piezoelectric element is a plurality of piezoelectric elements, the plurality of piezoelectric elements are divided into two groups, and the piezoelectric elements in each of the groups are arranged in a first direction, and are arranged adjacently to two opposite side edges of the substrate.

8. The piezoelectric device according to claim 7, wherein a material of the first electrode and a material of the second electrode comprise platinum.

9. The piezoelectric device according to claim 3, wherein a film-layer stress of the first electrode, a film-layer stress of the piezoelectric layer and a film-layer stress of the second electrode are greater than or equal to −300 MPa, and less than or equal to 300 MPa.

10. The piezoelectric device according to claim 3, wherein the first electrode is disposed close to the substrate, an edge of the second electrode is retracted relative to an edge of the piezoelectric layer, and a retraction amount is greater than or equal to 100 μm, and less than or equal to 500 μm.

11. The piezoelectric device according to claim 3, wherein the first electrode is connected to ground, the second electrode is connected to an alternating-current-signal input terminal, the alternating-current-signal input terminal is for inputting an alternating-current signal, and a frequency of the alternating-current signal is equal to an inherent frequency of the substrate.

12. The piezoelectric device according to claim 3, wherein the piezoelectric device further comprises a touch-controlling layer, and the touch-controlling layer is disposed on one side of the piezoelectric element that is close to or further from the substrate.

* * * * *